US009549466B2

(12) United States Patent
Fan et al.

(10) Patent No.: US 9,549,466 B2
(45) Date of Patent: Jan. 17, 2017

(54) CIRCUIT BOARD AND MANUFACTURING METHOD THEREOF

(71) Applicant: Wistron Corporation, New Taipei (TW)

(72) Inventors: Jui-Yun Fan, New Taipei (TW); Hui-Lin Lu, New Taipei (TW); Howard Huang, New Taipei (TW); Zheng-Wei Wu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/977,658

(22) Filed: Dec. 22, 2015

(65) Prior Publication Data

US 2016/0113111 A1 Apr. 21, 2016

Related U.S. Application Data

(63) Continuation of application No. 14/029,809, filed on Sep. 18, 2013, now Pat. No. 9,271,404.

(30) Foreign Application Priority Data

Dec. 17, 2012 (CN) .......................... 2012 1 0549969

(51) Int. Cl.
*H05K 1/00* (2006.01)
*H05K 1/11* (2006.01)
(Continued)

(52) U.S. Cl.
CPC ............. *H05K 1/0298* (2013.01); *H05K 1/115* (2013.01); *H05K 3/0073* (2013.01); *H05K 3/341* (2013.01);
(Continued)

(58) Field of Classification Search
CPC .. H05K 1/0298; H05K 3/3447; H05K 3/3452; H05K 3/3484; H05K 2201/09909; H05K 2203/0588; H05K 1/115; H05K 3/0073; H05K 3/341; H05K 3/4664; H05K 2203/04; Y10T 29/49165
(Continued)

(56) References Cited

U.S. PATENT DOCUMENTS 4,512,829 A * 4/1985 Ohta ...................... H05K 3/243 156/280
4,735,676 A * 4/1988 Iwasa ..................... H05K 3/246 216/105

(Continued)

FOREIGN PATENT DOCUMENTS

CN 202475955 10/2012

OTHER PUBLICATIONS

"Office Action of China Counterpart Application", issued on Jun. 2, 2016, with English translation thereof, p.1-p.15.

*Primary Examiner* — Sherman Ng
(74) *Attorney, Agent, or Firm* — Jianq Chyun IP Office

(57) ABSTRACT

A circuit board includes a circuit board plate, a conductive ring, a solder mask and at least one insulating pad. The circuit board plate includes a surface and a conductive through hole passing through the surface and the circuit board plate, wherein the conductive through hole have a conductive layer disposed on a wall thereof. The conductive ring on the surface surrounds an opening of the conductive through hole on the surface and electrically connects to the conductive layer. The solder mask is disposed on the surface. The conductive ring is exposed outside of the solder mask. The insulating pad has a thickness. The first surface of the insulating pad is adapted to contact the solder mask or the surface and sited at periphery of the conductive ring. The second surface of the insulating pad is adapted for spacing a distance between a solder coating tool and the solder mask.

9 Claims, 4 Drawing Sheets

(51) Int. Cl.

| | |
|---|---|
| ***H01K 3/10*** | (2006.01) |
| ***H05K 1/02*** | (2006.01) |
| ***H05K 3/00*** | (2006.01) |
| ***H05K 3/46*** | (2006.01) |
| *H05K 3/34* | (2006.01) |

(52) U.S. Cl.
CPC .......... *H05K 3/3452* (2013.01); *H05K 3/4664* (2013.01); *H05K 3/3447* (2013.01); *H05K 3/3484* (2013.01); *H05K 2201/09909* (2013.01); *H05K 2203/04* (2013.01); *H05K 2203/0588* (2013.01); *Y10T 29/49165* (2015.01)

(58) Field of Classification Search
USPC ............. 174/262–266, 258; 29/852; 361/767
See application file for complete search history.

(56) References Cited

U.S. PATENT DOCUMENTS

| | | | | |
|---|---|---|---|---|
| 5,210,940 A * | 5/1993 | Kawakami ........... | H05K 3/4069 174/262 |
| 5,268,194 A * | 12/1993 | Kawakami ........... | H05K 3/4053 427/98.2 |
| 2011/0173808 A1 * | 7/2011 | Wu ..................... | H05K 3/3415 29/840 |

* cited by examiner

CIRCUIT BOARD AND MANUFACTURING METHOD THEREOF

CROSS-REFERENCE TO RELATED APPLICATION

This application is a continuation application of and claims the priority benefit of a prior application Ser. No. 14/029,809, filed on Sep. 18, 2013, now pending. The prior application Ser. No. 14/029,809 claims the priority benefit of China application serial no. 201210549969.5, filed on Dec. 17, 2012. The entirety of each of the above-mentioned patent applications is hereby incorporated by reference herein and made a part of this specification.

BACKGROUND OF THE INVENTION

Field of the Invention

The invention relates to a circuit board and a method of manufacturing the same. In particular, the present invention relates to a circuit board capable of reducing missing solder of an electronic component during through hole standard package and a method of manufacturing the same.

Description of Related Art

With multitasking and miniaturization of electronic products today, sizes of circuit boards in electronic products may be relatively reduced. An electronic component with fine pitch is usually used for disposing on the circuit board having limited space, but such method may increase difficulties in its manufacturing process. For instance, during a process of surface mount technology (SMT) for a circuit board, various electronic components with different types and pitches are usually disposed on the same circuit board, thus it is difficult to control an amount of a solder (e.g., solder paste) to be printed.

Generally, a steel plate is used while printing the solder in manufacturing process of the circuit board, and a thickness of the steel plate may affect the amount of the solder to be printed. Therefore, the thickness is selectively changed during the process of surface mount according to the pitches of the electronic components. To solve a shortage problem caused by fine pitch, the steel plate cannot be too thick. However, for electronic components adopting through hole standard package technology such as dual inline package (DIP), a missing solder due to insufficient amount of the solder may occur after reflow.

SUMMARY OF THE INVENTION

The invention is directed to a circuit board, which may effectively reduce the chances in missing solder of the dual inline package (DIP) electronic component from occurring.

The invention provides a manufacturing method of a circuit board for manufacturing above-said circuit board.

The invention provides a circuit board including a circuit board plate, a conductive ring, a solder mask and at least one insulating pad. The circuit board plate includes a surface and a conductive through hole passing through the surface and the circuit board plate, wherein the conductive through hole have a conductive layer disposed on a wall thereof. The conductive ring is disposed on the surface, the conductive ring surrounds an opening of the conductive through hole located on the surface and electrically connects to the conductive layer. The solder mask is disposed on the surface and the conductive ring is exposed outside of the solder mask. The insulating pad includes a first surface and a second surface opposite to each other and having a thickness, the first surface is adapted to contact the solder mask or the surface of the circuit board plate and sited at periphery of the conductive ring, the second surface is adapted to contact a solder coating tool when the solder coating tool is covered on the circuit board thereby spacing a distance between the solder coating tool and the solder mask.

The invention further provides a manufacturing method of a circuit board, including the following steps. A circuit board plate is provided, in which the circuit board plate includes a surface and a conductive through hole passing through the surface and the circuit board plate, wherein the conductive through hole have a conductive layer disposed on a wall thereof. A conductive ring is disposed on the surface, in which the conductive ring surrounds an opening of the conductive through hole located on the surface and electrically connects to the conductive layer. A solder mask is disposed on the surface, in which the conductive ring is exposed outside of the solder mask. At least one insulating pad having a thickness is disposed onto the solder mask or the surface of the circuit board plate, wherein the at least one insulating pad sited at periphery of the conductive ring.

According to an embodiment of the invention, a solder coating tool is further placed onto the circuit board plate, in which the solder coating tool is configured to contact the at least one insulating pad to space a distance from the conductive ring, and the solder coating tool includes an opening corresponding to the conductive ring. A solder is injected into the opening, a space surrounded by the at least one insulating pad and the conductive through hole. An electronic component is placed onto the solder, in which the electronic component is a dual in-line package. A reflow is performed to fix the electronic component to the circuit board plate.

Based on above, by disposing insulating pad on the solder mask or on the circuit board plate, the circuit board of the invention may have the insulating pad to boost height of the solder coating tool placed on the circuit board plate, so as to increase the space for containing the solder while printing the solder. As a result, thickness of solder may be increased to effectively reduce the chances in missing solder of the dual inline package (DIP) electronic component from occurring.

To make the above features and advantages of the invention more comprehensible, several embodiments accompanied with drawings are described in detail as follows.

DESCRIPTION OF THE EMBODIMENTS

Figure 1A:
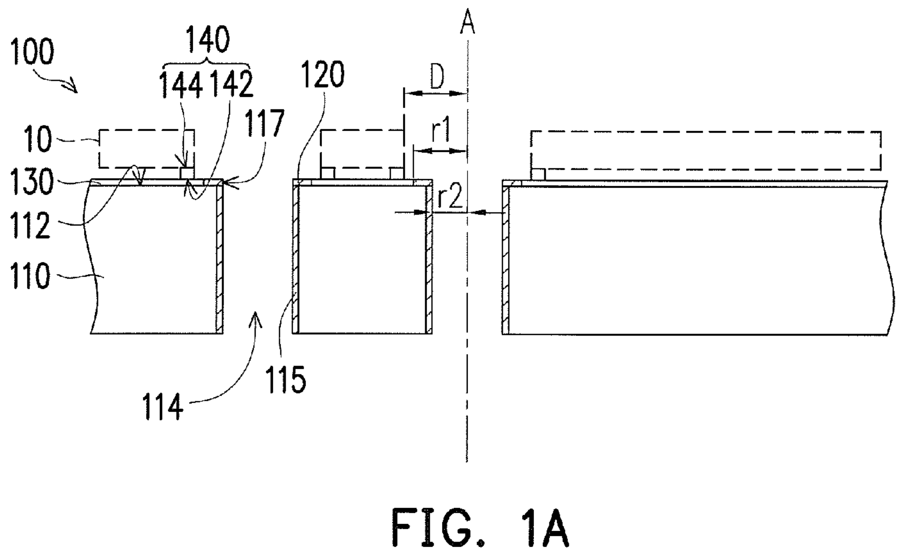
FIG. 1A is a schematic cross-sectional view illustrating a circuit board according to a first embodiment of the invention.
Figure 1B:
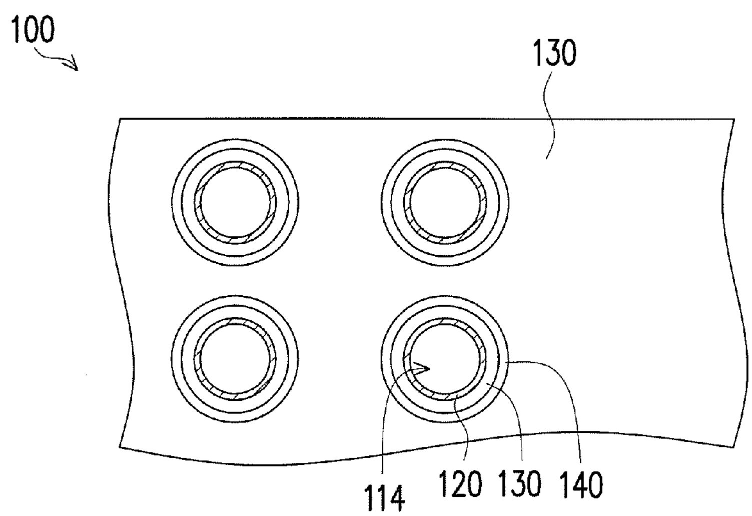
FIG. 1B is a schematic top view illustrating the circuit board depicted in FIG. 1A.

FIG. 1A is a schematic cross-sectional view illustrating a circuit board according to a first embodiment of the invention. FIG. 1B is a schematic top view illustrating the circuit board depicted in FIG. 1A. Referring to FIG. 1A and FIG. 1B together, a circuit board 100 of the present embodiment includes a circuit board plate 110, a conductive ring 120, a solder mask 130 and at least one insulating pad 140.

The circuit board plate 110 includes a surface 112 and a conductive through hole 114 passing through the surface 112 and the circuit board plate 110. The conductive through hole 114 has a conductive layer 115 disposed on a wall thereof, and the conductive through hole 114 is adapted for pins of a dual inline package (DIP) electronic component to be inserted and electrically connected to the conductive layer 115 on the wall of the conductive through hole 114. The conductive ring 120 is disposed on the surface 112, the conductive ring 120 surrounds an opening 117 of the conductive through hole 114 located on the surface 112 and electrically connects to the conductive layer 115 of the conductive through hole 114. In the present embodiment, the conductive ring 120 may be a copper foil ring, but types of the conductive ring 120 are not limited thereto. The solder mask 130 is disposed on the surface 112 and the conductive ring 120 is exposed outside of the solder mask 130. In the present embodiment, the solder mask 130 is a silkscreen (commonly known as green paint) which may be applied on the circuit board for solder masking and insulation, but types of the solder mask 130 are not limited thereto.

The insulating pad 140 includes a first surface 142 and a second surface 144 opposite to each other, the first surface 142 is adapted to contact the solder mask 130 and sited at periphery of the conductive ring 120, the second surface 144 is adapted to contact a solder coating tool 10 when the solder coating tool 10 is covered on the circuit board 100 thereby spacing a distance between the solder coating tool 10 and the solder mask 130. The solder coating tool 10 may be a steel plate for printing solder, but types of the solder coating tool 10 are not limited thereto. In the present embodiment, preferably, a thickness of the insulating pad 140 may be between 0.4 mm to 0.7 mm and a width of the insulating pad 140 may be approximately 0.3 mm, but the thickness and the width of the insulating pad 140 are not limited thereto.

According to the present embodiment, the circuit board plate 110 includes a plurality of the conductive through holes 114, the circuit board 100 includes a plurality of the insulating pads 140, an amount of the insulating pads are correspondingly related to an amount of the conductive through holes 114, but said relation in amounts of the insulating pads 140 and the conductive through holes 114 are not limited thereto. The conductive ring 120 located on the surface 112 of the circuit board plate 110 surrounds the conductive through hole 114, and the insulating pad 140 is disposed on the solder mask 130 outside of the conductive ring 120 as shown in FIG. 1B, or on the surface 112 of the circuit board plate 110 where the solder mask 130 is not present (not illustrated). The insulating pad 140 is not directed contacted to the conductive ring 120, and it is preferable that a gap between the insulating pad 140 and the conductive ring 120 being 0.2 mm, but the distance between the insulating pad 140 and the conductive ring 120 is not limited thereto, for example, they can be adjacent to each other without the gap or even being partially overlapped.

In the present embodiment, each of the insulating pads 140 is a closed ring (circular ring) separated from each other, and the conductive ring 120 is located within the closed ring. As shown in FIG. 1A, a distance D between each of the insulating pads 140 and a center A of the conductive through hole 114 is greater than a radius r1 of the conductive ring

120, and the radius r1 of the conductive ring 120 is greater than a radius r2 of the conductive through hole 114.

In addition, according to the present embodiment, a material of the insulating pad 140 includes a silkscreen. The solder mask 130 is generally printed with marks such as characters or geometrical forms, said marks are used to denote types of the electronic component to be placed thereon or mark locations of pins of the electronic component to be disposed thereon during manufacturing process. Said marks such as characters or geometrical forms are generally printed on the solder mask 130 or the surface 112 of the circuit board plate 110 by using the silkscreen. In the present embodiment, the insulating pad 140 may be printed together with said characters or geometrical forms, so as to omit additional steps of disposing the insulating pad 140 on the solder mask 130 or the circuit board plate 110. More preferably, a color of the silkscreen used on the insulating pad 140 may be different from a color of the silkscreen used on the solder mask 130, so as to facilitate in compartmentalization and recognizability. For instance, the color of the silkscreen on the solder mask 130 may be green, whereas the color of the silkscreen on the insulating pad 140 may be white. Of course, materials and colors of the insulating pad 140 are not particularly limited thereto. In other embodiments, the insulating pad 140 may also be a non-conductive material such as plastic or rubber, which can be fixed on the solder mask 130 or the surface 112 of the circuit board plate 110 using methods such as an adhering process.

Figure 2:
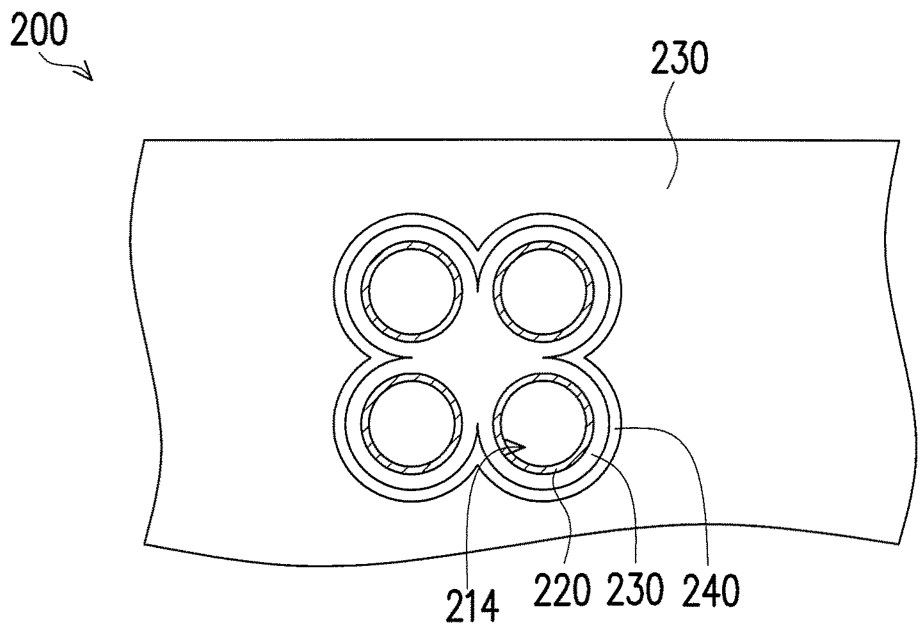
FIG. 2 is a schematic top view illustrating a circuit board according to a second embodiment of the invention.

FIG. 2 is a schematic top view illustrating a circuit board according to a second embodiment of the invention. Referring to FIG. 2, a major difference between a circuit board 200 depicted in FIG. 2 and the circuit board 100 depicted in FIG. 1A is described as follow. In FIG. 2, due to insufficient space, conductive through holes 214 are too close to each other, an insulating pad 240 may not be disposed the same way as illustrated in FIG. 1B where each of the insulating pads 140 independently surrounds one conductive ring 120. Therefore, in FIG. 2, only one insulating pad 240 is used to surround a plurality of conductive rings 220. In other words, the conductive rings 220 are all located within a region surrounded by the insulating pad 240. According to the present embodiment, the insulating pad 240 is still a closed ring, but a shape of the insulating pad 240 may be varied based on location and amount of the conductive rings 220, the shape is not necessary being the circular ring as shown in FIG. 1B. Of course, forms of the insulating pad 240 are not limited to the forgoing, as long as height of a solder coating tool placed on a solder mask 230 or the surface of the circuit board plate may be boosted and the insulating pad 240 are adjacent to the conductive ring 220.

In addition, since no insulating pad 240 is used to space apart different conductive rings 220, a solder on different conductive rings 220 may seem to connect each other accidentally when printing the solder (e.g., solder paste). Practically, during a reflow, communication cohesion of the solder paste that flowed into the conductive through hole 214 may separate solder paste on different conductive rings 220 so as to avoid shortage between two adjacent conductive rings 220 to occur.

The above two embodiments are illustrated by using the insulating pads of the closed ring, practically, said one insulating pad may also be a structure of non-closed ring such as a C-shape, which may be used when one side of the conductive ring is too close to other electronic components or edges of the plate.

Figure 3:
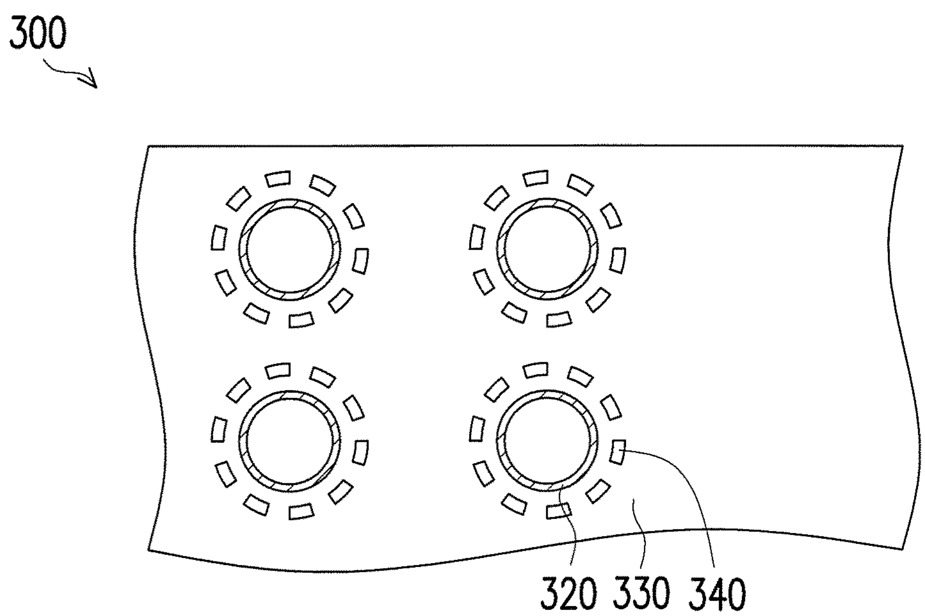
FIG. 3 is a schematic top view illustrating a circuit board according to a third embodiment of the invention.

FIG. 3 is a schematic top view illustrating a circuit board according to a third embodiment of the invention. Referring to FIG. 3, a major difference between a circuit board 300 depicted in FIG. 3 and the circuit board 100 depicted in FIG. 1A is described as follow. In FIG. 3, the circuit board 300 may include a plurality of insulating pads 340 for each conductive ring 320, the insulating pads 340 are distributed to jointly surround the conductive ring 320. In other words, the conductive ring 320 is not surrounded entirely by the insulating pads 340 as in a closed fashion.

In the present embodiment, an amount of the insulating pads 340 at periphery of each conductive ring 320 is 8. Due to a smaller thickness of the steel plate, the steel plate may be slightly bended by a force applied on the steel plate when a scraper is used to scrape off the solder on the steel plate. In this case, a distance between the steel plate and a solder mask 330 or the surface of the circuit board plate may be reduced accordingly. To avoid above-said situation, the insulating pads 340 that is denser or with a grater amount may be disposed at periphery of the conductive ring 320 to support the steel plate, so as to reduce chances of the force being applied on the steel plate when pressing the scraper down to the steel plate thereby reducing the distance between the steel plate and the colder mask 330 or the surface of the circuit board plate. However, the amount, the shape and the distribution of the insulating pads 340 are not particularly limited thereto.

In addition, in the present embodiment, since the insulating pads 340 may not be used as walls in the first embodiment to surround the solder paste therein, the solder paste may slightly leak outside of a surrounding range of the insulating pads 340. However, during the reflow, similarly, communication cohesion of the solder paste may allow the solder paste leaked outside of the surrounding range of the insulating pads 340 to retract, so as to avoid shortage between two adjacent conductive rings 320 to occur. Therefore, the insulating pads 340 in non-close fashion may achieve the effectiveness of boosting height of the solder coating tool placed on the solder mask 330 or the surface of the circuit board plate and shortage occurred between two adjacent conductive rings 320 may also avoided.

Figure 4:
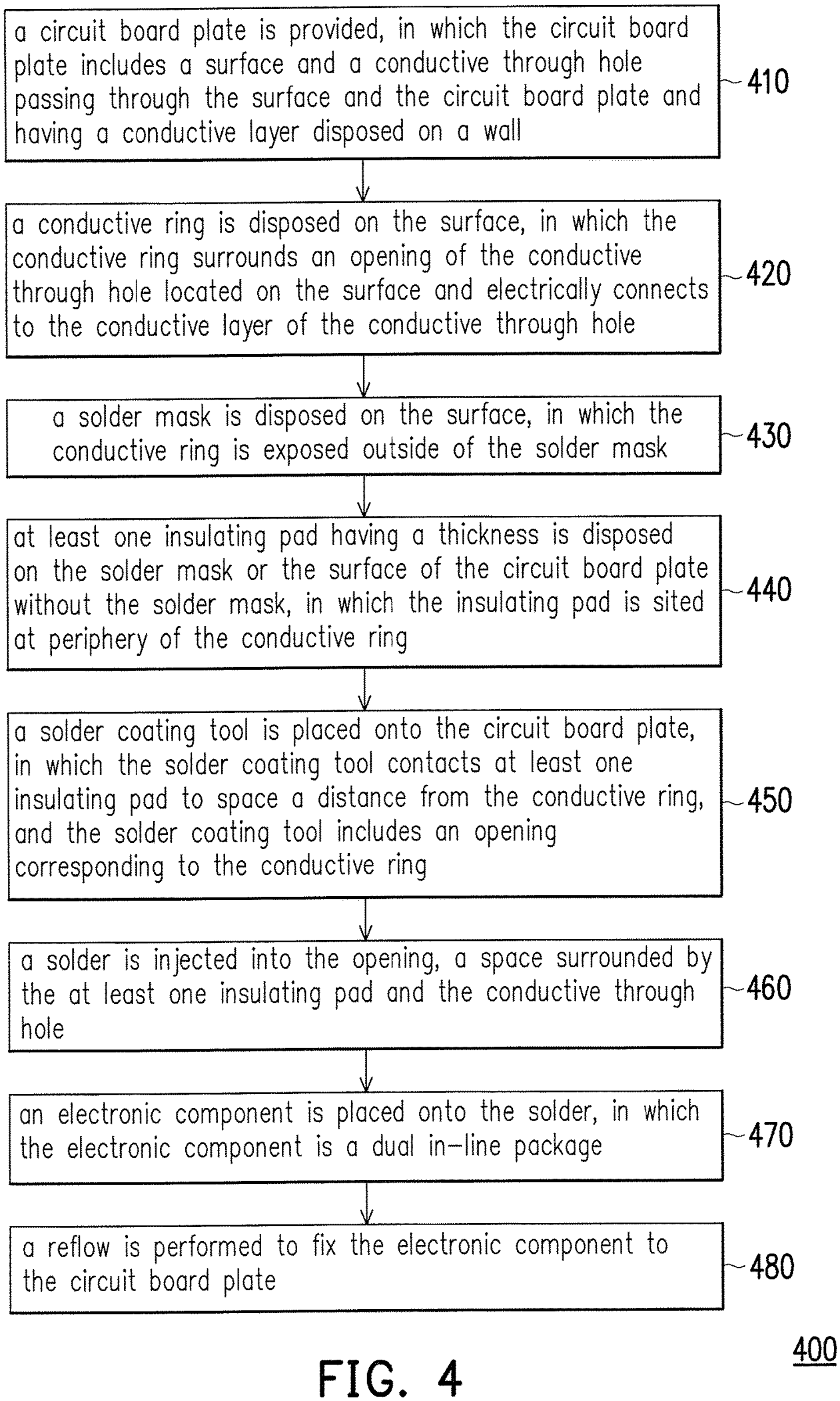
FIG. 4 is a schematic flow chart illustrating a manufacturing method of a circuit board according to an embodiment of the invention.

FIG. 4 is a schematic flow chart illustrating a manufacturing method of a circuit board according to an embodiment of the invention. Referring to FIG. 4, a manufacturing method of a circuit board according to the present embodiment includes the following steps.

First, a circuit board plate is provided, in which the circuit board plate includes a surface and a conductive through hole passing through the surface and the circuit board plate, wherein the conductive through hole have a conductive layer disposed on a wall thereof (step 410). An amount of the conductive through holes may be varied based on to the dual inline package (DIP) electronic component to be disposed, the amount of the conductive through holes is not limited to one.

Next, a conductive ring is disposed on the surface, in which the conductive ring surrounds an opening of the conductive through hole located on the surface and electrically connects to the conductive layer of the conductive through hole (step 420). Each opening located on the surface of the conductive through holes is surrounded by one conductive ring. In the present embodiment, the conductive ring may be a copper foil ring, but types of the conductive ring are not limited thereto. Further, a solder mask is disposed on the surface, in which the conductive ring is exposed outside of the solder mask (step 430). In the present embodiment, the solder mask may be a silkscreen, which may be applied on the circuit board for solder masking and insulation, but types of the solder mask are not limited thereto Subsequently, at least one insulating pad is disposed on the solder mask or the surface of the circuit board plate without the solder mask, in which the insulating pad is sited at periphery of the conductive ring (step 440) and has a fixed thickness. In the present embodiment, the insulating pad may be one separate closed ring, and the conductive ring is located within said closed ring. The insulating pads may also be in a form of blocks, the insulating pads may be distributed at periphery of the conductive ring and jointly surround one or more conductive ring, but the form of the insulating pads are not limited thereto. In addition, a material of the insulating may be a silkscreen printed together with marks on the solder mask such as characters and geometrical forms, but materials and dispositions of the insulating pads are limited thereto.

The circuit boards respectively depicted in FIG. 1A, FIG. 2 and FIG. 3 may be completed by performing steps 410 to step 440. Furthermore, a manufacturing method of fixing a dual inline package (DIP) electronic component to the circuit board is described as below.

Figure 5:
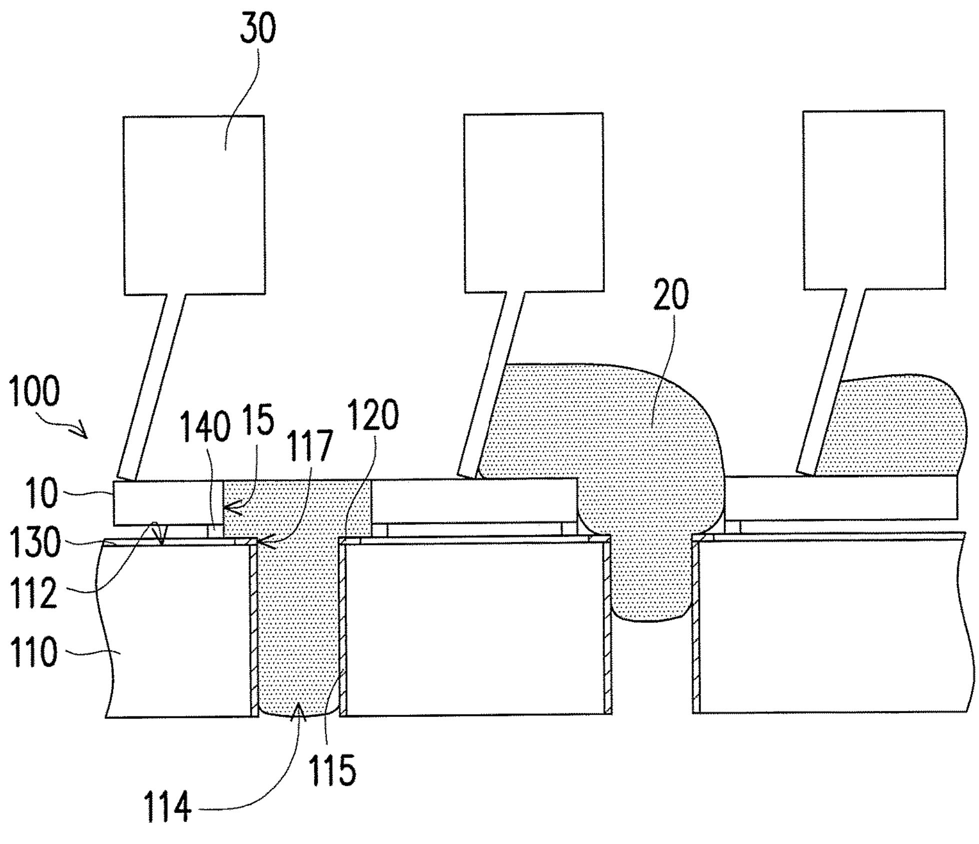
FIG. 5 is a schematic cross-sectional view of illustrating a manufacturing method of fixing a dual inline package electronic component to the circuit board depicted in FIG. 4.

Referring to FIG. 5, first, a solder coating tool 10 is placed onto the circuit board plate 110, in which the solder coating tool 10 contacts at least one insulating pad 140 to space a distance from the conductive ring 120, and the solder coating tool 10 includes an opening 117 corresponding to the conductive ring 120 (step 450).

Next, referring again to FIG. 5, a solder 20 is injected into an opening 15 of the solder coating tool 10, a space surrounded by the at least one insulating pad 140 and the conductive through hole 114 (step 460). In step 460, a scraper 30 may be moved onto the solder coating tool 10 to scratch the solder 20 (e.g., solder paste) into the opening 15, the insulating pad 140 and the conductive through hole 114. With the insulating pad 140 being disposed, the solder coating tool 10 may not be directly contacted to the solder mask 130 or the surface 112 of the circuit board plate 110 while having a distance from the solder mask 130. Accordingly, the conductive ring 120 may contain more solder 20 after step 460.

Next, an electronic component (not illustrated) is placed onto the solder 20, in which the electronic component is a dual in-line package (DIP) (step 470). In between steps 460 and 470, the circuit board 100 may be preheated to melt the solder 20 for pacing the electronic component thereto.

Lastly, a reflow is performed to fix the electronic component to the circuit board plate 110 (step 480). After step 480, the electronic component is fixed on the circuit board 100 and electronically connected to the conductive through hole 114 through solder 20. The manufacturing method of the circuit board according to the present embodiment may increase the amount of the solder by disposing the insulating pads 140, so as to reduce the chances in missing solder of the dual inline package (DIP) electronic component from occurring due to insufficient solder.

In view of above, by disposing insulating pad on the solder mask, the circuit board of the present invention may have the insulating pad to boost height of the solder coating tool placed on the circuit board plate, so as to increase the space for containing the solder. As a result, thickness and amount of solder may both be increased to effectively reduce the chances in missing solder of the dual inline package (DIP) electronic component from occurring due to insufficient solder.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A circuit board, comprising:

a circuit board plate comprising a surface and a conductive through hole passing through the surface and the circuit board plate, wherein the conductive through hole have a conductive layer disposed on a wall thereof;

a conductive ring disposed on the surface, wherein the conductive ring surrounds an opening of the conductive through hole located on the surface and electrically connects to the conductive layer;

a solder mask disposed on the surface, wherein the conductive ring is exposed outside of the solder mask; and at least one insulating pad comprising a first surface and a second surface opposite to each other and having a thickness, wherein the first surface is adapted to contact the solder mask or the surface of the circuit board plate and sited at periphery of the conductive ring, the second surface is adapted to contact a solder coating tool when the solder coating tool is covered on the circuit board thereby spacing a distance between the solder coating tool and the solder mask, wherein the at least one insulating pad is a closed ring, the conductive ring is located within the closed ring, and the at least one of the insulating pad surrounds a corresponding plurality of the conductive rings.

2. The circuit board of claim 1, wherein a material of the insulating pad comprises a silkscreen.

3. The circuit board of claim 2, wherein a color of the silkscreen is different from a color of the solder mask.

4. The circuit board of claim 1, wherein a distance between each of the at least one insulating pad and a center of the conductive through hole is greater than a radius of the conductive ring.

5. A manufacturing method of a circuit board, comprising:

providing a circuit board plate, wherein the circuit board plate comprises a surface and a conductive through hole passing through the surface and the circuit board plate, wherein the conductive through hole have a conductive layer disposed on a wall thereof;

disposing a conductive ring on the surface, wherein the conductive ring surrounds an opening of the conductive through hole located on the surface and electrically connects to the conductive layer;

disposing a solder mask on the surface, wherein the conductive ring is exposed outside of the solder mask; and disposing at least one insulating pad having a thickness onto the solder mask or the surface of the circuit board plate, wherein the at least one insulating pad sited at periphery of the conductive ring, wherein the at least one insulating pad is a closed ring, the conductive ring is located within the closed ring, and the at least one of the insulating pad surrounds a corresponding plurality of the conductive rings.

6. The manufacturing method of claim 5, further comprising:

placing a solder coating tool onto the circuit board plate, wherein the solder coating tool is configured to contact the at least one insulating pad to space a distance from the conductive ring, and the solder coating tool comprises an opening corresponding to the conductive ring;

injecting a solder into the opening, a space surrounded by the at least one insulating pad and the conductive through hole;

placing an electronic component onto the solder, wherein the electronic component is a dual in-line package; and performing a reflow to fix the electronic component to the circuit board plate.

7. The manufacturing method of claim 5, wherein a material of the insulating pad comprises a silkscreen.

8. The manufacturing method of claim 7, wherein a color of the silkscreen is different from a color of the solder mask.

9. The manufacturing method of claim 5, wherein a distance between each of the at least one insulating pad and a center of the conductive through hole is greater than a radius of the conductive ring.

* * * * *